United States Patent
Su et al.

(10) Patent No.: US 12,361,199 B2
(45) Date of Patent: Jul. 15, 2025

(54) INTEGRATED CIRCUIT LAYOUT GENERATION METHOD

(71) Applicant: TAIWAN SEMICONDUCTOR MANUFACTURING COMPANY, LTD., Hsinchu (TW)

(72) Inventors: Ke-Ying Su, Hsinchu (TW); Jon-Hsu Ho, Hsinchu (TW); Ke-Wei Su, Hsinchu (TW); Liang-Yi Chen, Hsinchu (TW); Wen-Hsing Hsieh, Hsinchu (TW); Wen-Koi Lai, Hsinchu (TW); Keng-Hua Kuo, Hsinchu (TW); KuoPei Lu, Hsinchu (TW); Lester Chang, Hsinchu (TW); Ze-Ming Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/421,644

(22) Filed: Jan. 24, 2024

(65) Prior Publication Data
US 2024/0160828 A1 May 16, 2024

Related U.S. Application Data

(60) Continuation of application No. 17/860,919, filed on Jul. 8, 2022, now Pat. No. 11,907,636, which is a
(Continued)

(51) Int. Cl.
G06F 30/398 (2020.01)
G03F 1/36 (2012.01)
(Continued)

(52) U.S. Cl.
CPC .............. *G06F 30/398* (2020.01); *G03F 1/36* (2013.01); *G03F 1/70* (2013.01); *G06F 30/20* (2020.01)

(58) Field of Classification Search
USPC ......................................................... 716/52
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |
| (Continued) | | |

FOREIGN PATENT DOCUMENTS

| CN | 105631087 | 12/2018 |
| TW | 201729133 | 8/2017 |

OTHER PUBLICATIONS

B. Razavi, Ran-Hong Yan and K. F. Lee, "Impact of distributed gate resistance on the performance of MOS devices," in IEEE Transactions on Circuits and Systems I: Fundamental Theory and Applications, vol. 41, No. 11, pp. 750-754, Nov. 1994, doi: 10.1109/81.331530. Also found at: https://ieeexplore.ieee.org/abstract/document/331530.

*Primary Examiner* — Mohammed Alam
(74) *Attorney, Agent, or Firm* — Hauptman Ham, LLP

(57) ABSTRACT

A method of generating an IC layout diagram includes receiving an IC layout diagram including a gate region and a gate via, the gate via being positioned at a location within an active region and along a width of the gate region extending across the active region, receiving a first gate resistance value of the gate region, retrieving a second gate resistance value from a resistance value reference based on the location and the width, using the first and second resistance values to determine that the IC layout diagram does not comply with a design specification, and based on
(Continued)

the non-compliance with the design specification, modifying the IC layout diagram.

20 Claims, 9 Drawing Sheets

Related U.S. Application Data division of application No. 16/950,999, filed on Nov. 18, 2020, now Pat. No. 11,392,749, which is a continuation of application No. 16/389,679, filed on Apr. 19, 2019, now Pat. No. 10,846,456.

(60) Provisional application No. 62/665,660, filed on May 2, 2018.

(51) Int. Cl.
    G03F 1/70      (2012.01)
    G06F 30/20     (2020.01)

(56) References Cited

U.S. PATENT DOCUMENTS

| 10,796,059 | B2 | 10/2020 | Su et al. |
| 2002/0188920 | A1 | 12/2002 | Lampaert et al. |
| 2004/0065939 | A1* | 4/2004 | Maget .................. H01L 27/0808 257/E29.345 |
| 2006/0107246 | A1* | 5/2006 | Nakamura .............. G06F 30/36 716/113 |
| 2007/0078638 | A1* | 4/2007 | McDonald .......... G06F 30/3323 703/14 |
| 2008/0273366 | A1* | 11/2008 | Braceras ................ G11C 11/413 365/63 |
| 2009/0313596 | A1* | 12/2009 | Lippmann ............. G06F 30/327 716/126 |
| 2013/0173214 | A1* | 7/2013 | Yamashita ............. G01B 7/023 702/170 |
| 2014/0040838 | A1* | 2/2014 | Liu .......................... G03F 1/36 716/53 |
| 2014/0129195 | A1* | 5/2014 | He .......................... G06F 30/20 703/2 |
| 2015/0278429 | A1* | 10/2015 | Chang ....................... G03F 1/36 716/52 |
| 2015/0372087 | A1* | 12/2015 | Fachmann .......... H01L 29/7811 257/329 |
| 2017/0018302 | A1* | 1/2017 | Yin ....................... G11C 11/417 |
| 2017/0178716 | A1* | 6/2017 | Yin ...................... H01L 23/5226 |
| 2018/0239857 | A1* | 8/2018 | Qin ...................... G06F 30/392 |
| 2019/0294750 | A1* | 9/2019 | Su ......................... G06F 30/398 |
| 2019/0340328 | A1* | 11/2019 | Su .............................. G03F 1/36 |
| 2021/0073454 | A1* | 3/2021 | Su .............................. G03F 1/36 |

* cited by examiner

INTEGRATED CIRCUIT LAYOUT GENERATION METHOD

PRIORITY CLAIM

The present application is a divisional of U.S. application Ser. No. 17/860,919, filed Jul. 8, 2022, now U.S. Pat. No. 11,907,636, issued Feb. 20, 2024, which is a divisional of U.S. application Ser. No. 16/950,999, filed Nov. 18, 2020, now U.S. Pat. No. 11,392,749, issued Jul. 19, 2022, which is a continuation of U.S. application Ser. No. 16/389,679, filed Apr. 19, 2019, now U.S. Pat. No. 10,846,456, issued Nov. 24, 2020, which claims the priority of U.S. Provisional Application No. 62/665,660, filed May 2, 2018, each of which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. Miniaturization has been achieved through design and manufacturing innovations tied to increasingly strict specifications. Various electronic design automation (EDA) tools are used to generate, revise, and verify designs for semiconductor devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
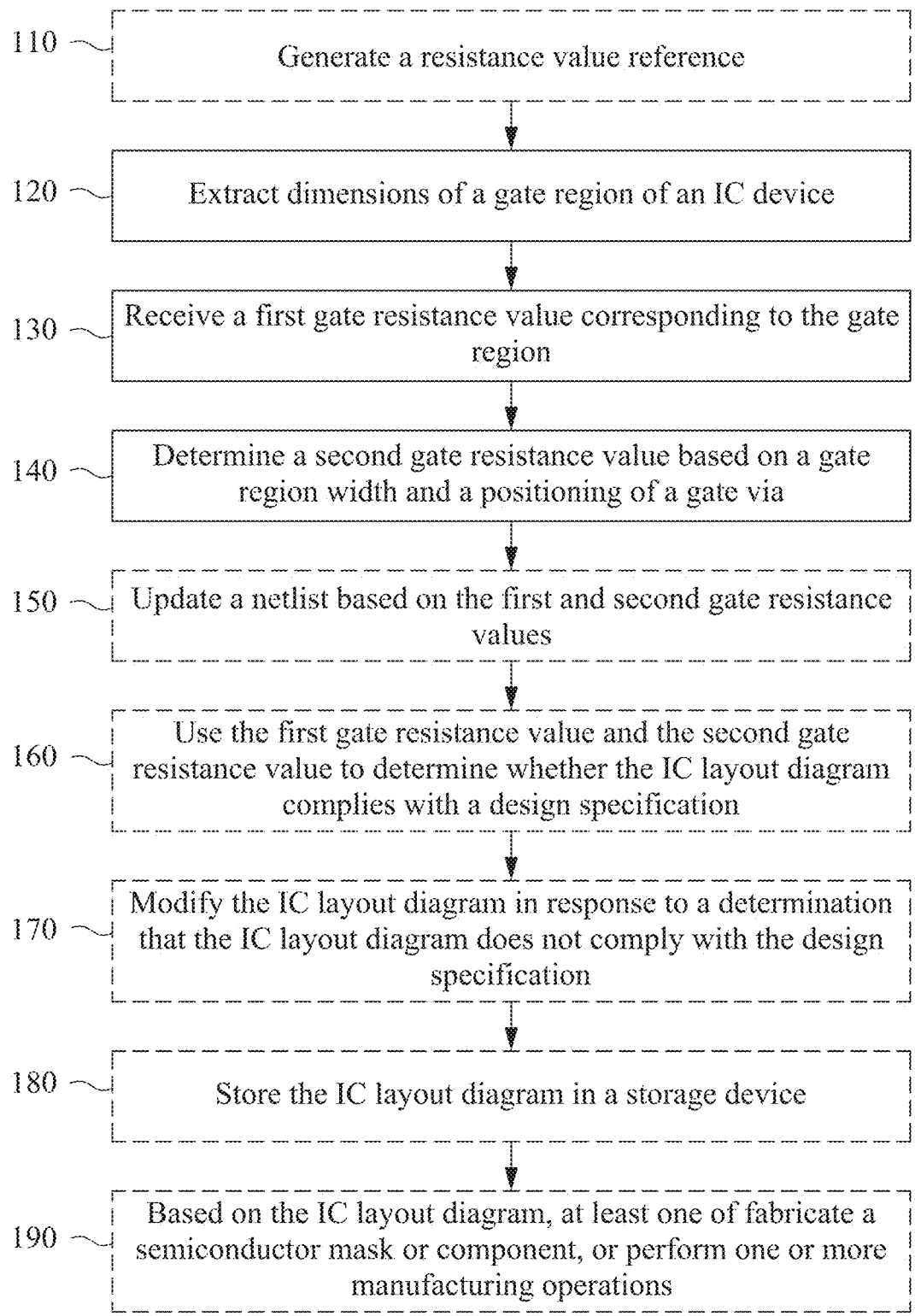
FIG. 1 is a flowchart of a method of generating a netlist of an IC device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a layout of an IC device includes one or more gate vias positioned along a gate width corresponding to an active region. After obtaining a first modeled gate resistance based on the via positioning, a second modeled gate resistance is determined and used to either verify that the first modeled gate resistance is sufficiently large, or update a netlist of the IC device. Updating the netlist includes adding a resistor at the terminal node of the gate, the resistor having a resistance value based on a difference between the modeled gate resistances. The first modeled gate resistance is thereby increased to improve accuracy and avoid underestimating gate resistance values compared to gate resistance modeling methods that do not include determining a second modeled gate resistance value.

Figure 2A:
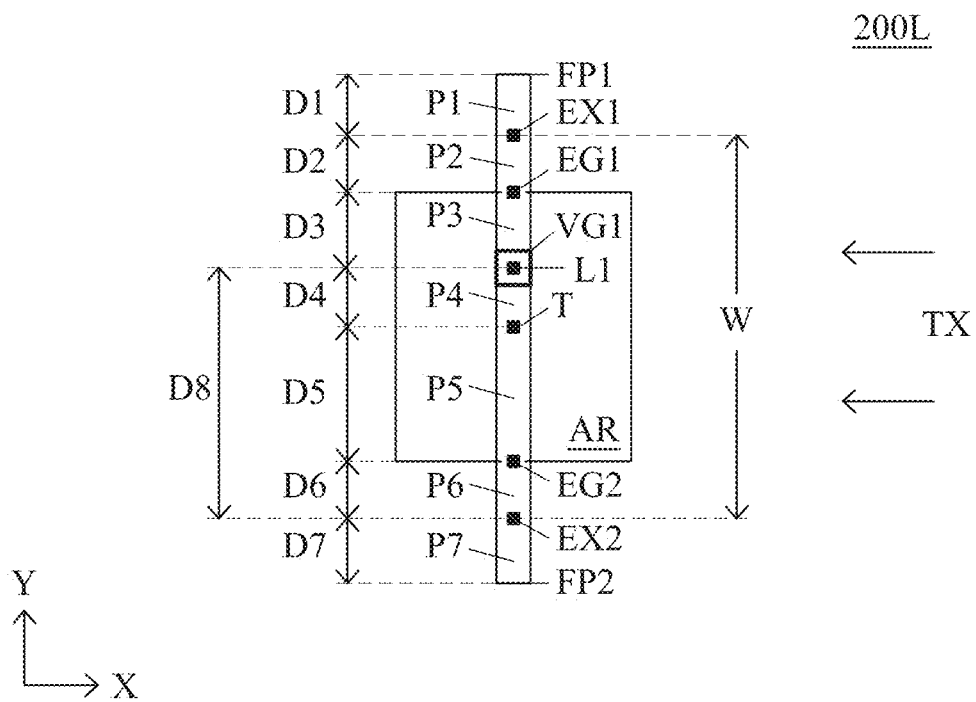
FIG. 2A depicts a layout diagram of an IC device, in accordance with some embodiments.
Figure 2B:
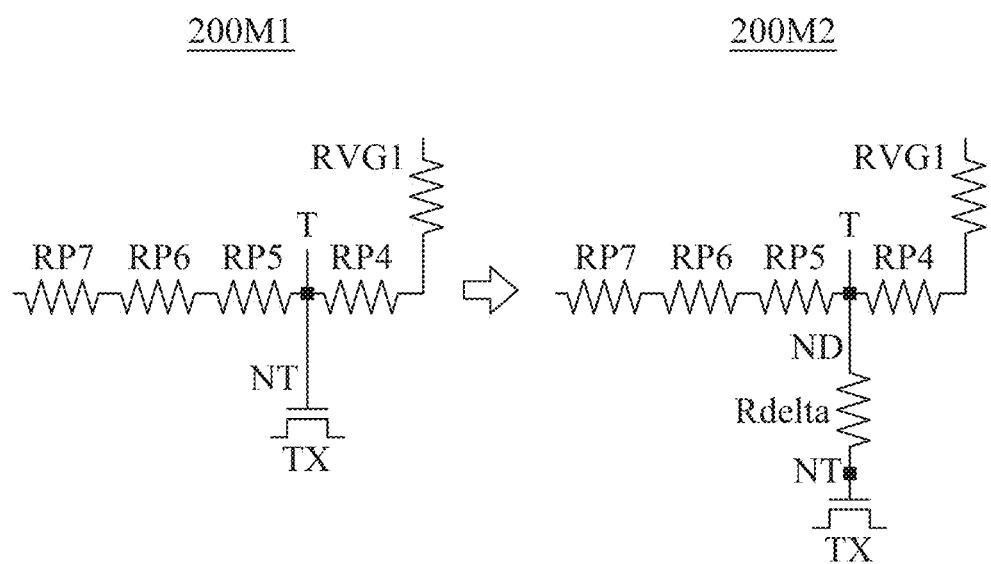
FIG. 2B depicts a gate resistance model, in accordance with some embodiments.
Figure 3A:
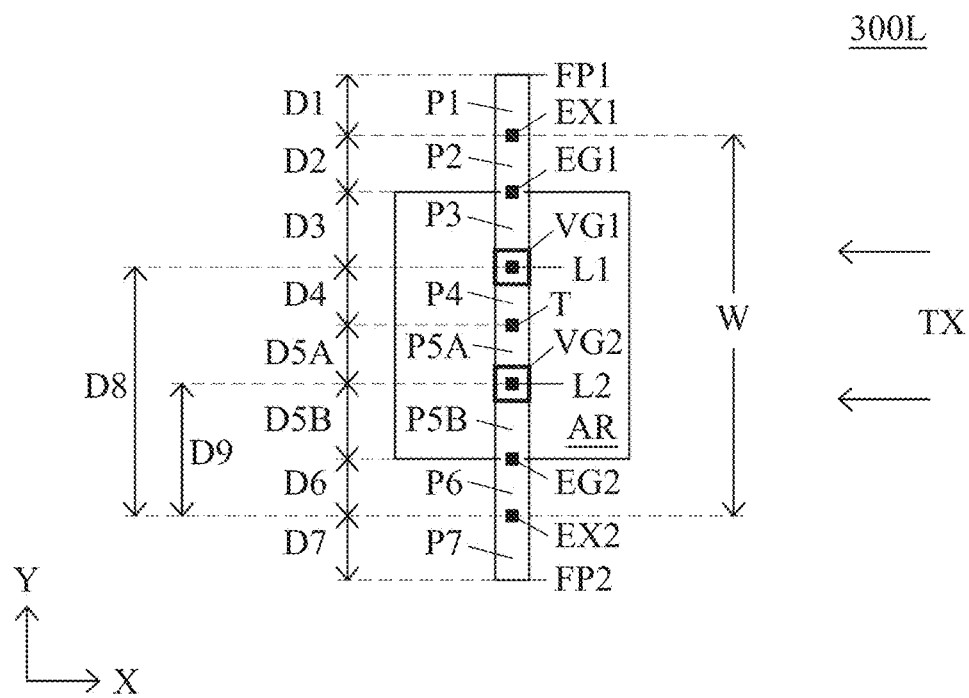
FIG. 3A depicts a layout diagram of an IC device, in accordance with some embodiments.
Figure 3B:
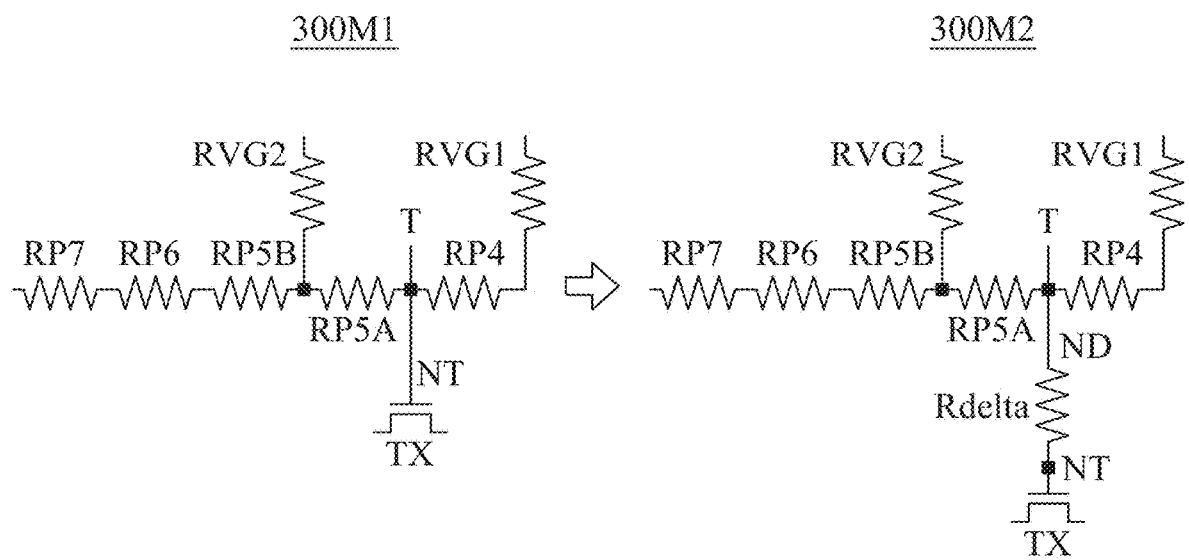
FIG. 3B depicts a gate resistance model, in accordance with some embodiments.
Figure 4:
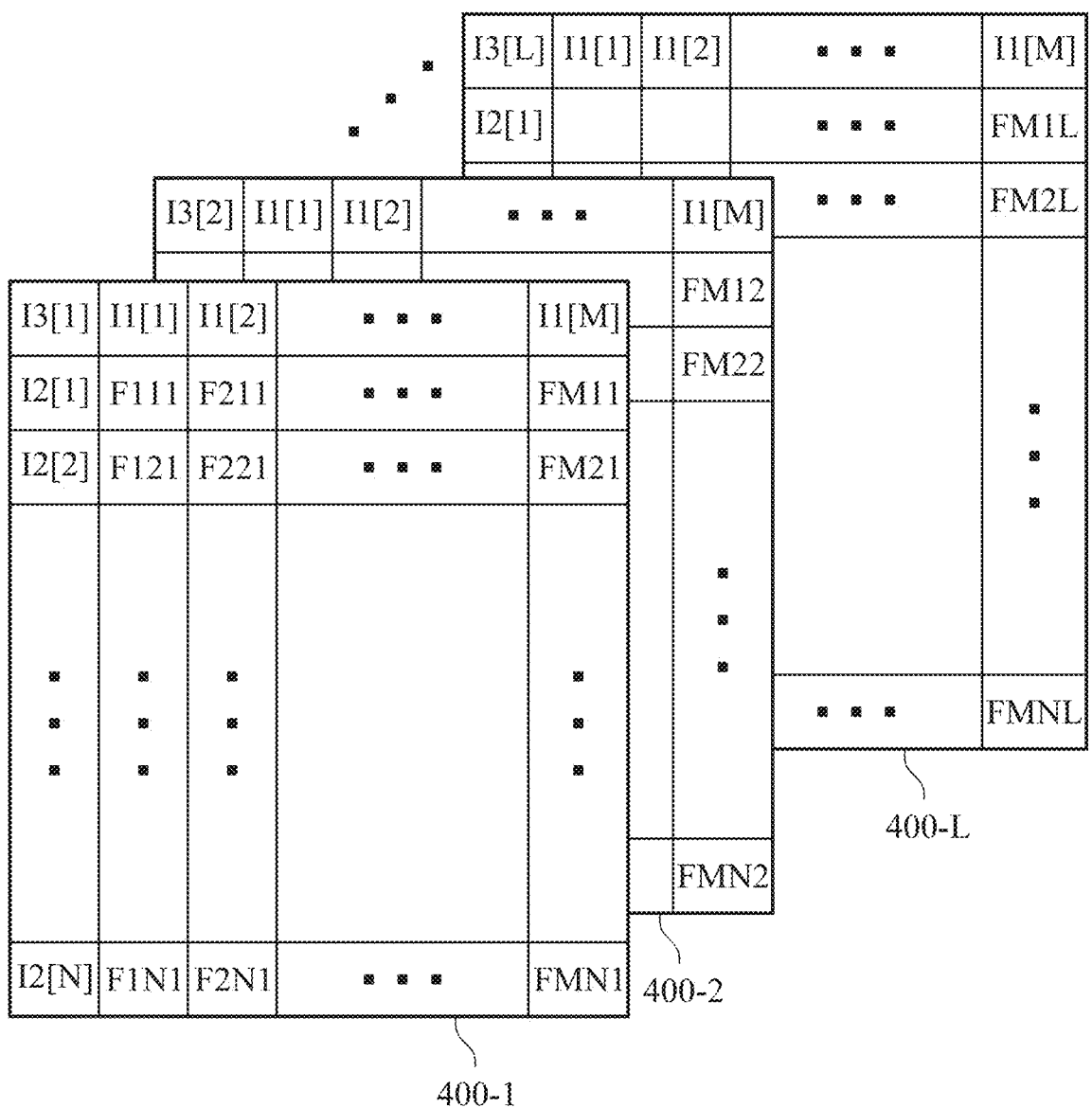
FIG. 4 depicts a gate resistance table, in accordance with some embodiments.

An embodiment of the modeling operations is provided in a method 100, depicted in FIG. 1 and illustrated using FIGS. 2A-6I. Each of FIGS. 2A and 3A depicts an example IC device layout, and each of FIGS. 2B and 3B provides a schematic representation of modifying a netlist corresponding to the layout by adding a resistor Rdelta. FIG. 4 is an example of a gate resistance table usable to determine second modeled gate resistances, and FIGS. 5A and 5B are example gate models usable to determine first modeled gate resistances. FIGS. 6A-6I are example gate models usable to determine first and second modeled gate resistances for various gate via configurations.

FIG. 1 is a flowchart of method 100 of generating a layout diagram of an IC device, in accordance with some embodiments. In some embodiments, generating the layout diagram of the IC device includes generating a netlist of the IC device. In some embodiments, generating the layout diagram of the IC device includes modeling a gate of a transistor, e.g., a planar transistor or a fin field-effect transistor (FinFET). In some embodiments, the transistor is one transistor of a plurality of transistors included in the IC device, non-limiting examples of which include memory circuits, logic devices, processing devices, signal processing circuits, or the like.

In some embodiments, some or all of method 100 is executed by a processor of a computer. In some embodiments, some or all of method 100 is executed by a processor 702 of an IC device design system 700, discussed below with respect to FIG. 7.

Some or all of the operations of method 100 are capable of being performed as part of a design procedure performed in a design house, e.g., a design house 820 discussed below with respect to FIG. 8.

In some embodiments, the operations of method 100 are performed in the order depicted in FIG. 1. In some embodiments, the operations of method 100 are performed in an order other than the order depicted in FIG. 1. In some embodiments, one or more operations are performed before, between, during, and/or after performing one or more operations of method 100.

Each of FIGS. 2A and 3A depicts a non-limiting example of a respective IC layout diagram 200L or 300L of an IC device. In the embodiment depicted in FIG. 2A, layout diagram 200L includes a single gate via VG1 positioned within an active region AR and along a width W. In the embodiment depicted in FIG. 3A, layout diagram 300L includes gate vias VG1 and VG2, each positioned within active region AR and along width W. Each of IC layout diagrams 200L and 300L also includes a plurality of poly regions P1-P7 that collectively divide active region AR into two source/drain regions (not labeled), thereby at least partially defining a transistor TX.

In addition to the respective IC layout diagram 200L or 300L, each of FIGS. 2A and 3A depicts a direction X, and a direction Y perpendicular to direction X. The orientations of IC layout diagrams 200L and 300L depicted with respect to directions X and Y are non-limiting examples used for the purpose of illustration. In various embodiments, one or both of IC layout diagrams 200L or 300L has an orientation with respect to directions X and Y other than that depicted in the corresponding one or both of FIGS. 2A and 3A.

Active region AR is a region in the IC layout diagram used in a manufacturing process as part of defining an active area, also referred to as an oxide diffusion or definition (OD), in a semiconductor substrate in which one or more IC device features, e.g., a source/drain feature, is formed. In various embodiments, an active area is an n-type or p-type active area of a planar transistor or a FinFET.

Plurality of poly regions P1-P7 includes regions in the IC layout diagram used in the manufacturing process as part of defining a gate structure in the IC device, the gate structure including at least one of a conductive material or a dielectric material. In various embodiments, some or all of the gate structure corresponding to plurality of poly regions P1-P7 includes at least one conductive material, e.g., a metal and/or a polysilicon (poly) material, overlying at least one dielectric material, e.g., a silicon dioxide and/or a high-k dielectric material.

In the embodiments depicted in FIGS. 2A and 3A, the poly regions of plurality of poly regions P1-P7 are aligned with each other along the Y direction and correspond to entireties or portions of distances D1-D9, defined along the Y direction. As discussed below, distances D1-D9 are usable as part of obtaining and/or determining modeled gate resistances based on the positioning of gate via VG1 and, if applicable, gate via VG2.

Plurality of poly regions P1-P7 is depicted as separate regions in FIGS. 2A and 3A for the purpose of illustration. In various embodiments, two or more poly regions of plurality of poly regions P1-P7 are combined into a single region in the IC layout diagram of the IC device. In some embodiments, poly regions P2-P6 are combined into a single region used to define a portion of the gate structure having a configuration different from a configuration corresponding to one or both of poly regions P1 or P7.

Each gate via VG1 and VG2 is a region in the IC layout diagram used in the manufacturing process as part of defining one or more segments of one or more conductive layers in the IC device configured to form an electrical connection between the gate structure corresponding to plurality of poly regions P1-P7 and one or more conductive layer segments overlying the gate structure. In various embodiments, the one or more conductive layer segments formed based on each gate via VG1 and VG2 includes a metal, e.g., copper, and forms an electrical connection to a metal zero, a metal one, or a metal two layer of the IC device.

In various embodiments, each of IC layout diagrams 200L and 300L includes features in addition to active region AR, plurality of poly regions P1-P7, and gate vias VG1 and VG2, e.g., one or more additional transistors, active regions, poly regions, and/or gate vias, and/or one or more isolation regions, source/drain regions, well regions, and/or interconnect features, that are not depicted in FIGS. 2A and 3A for the purpose of clarity.

Plurality of poly regions P1-P7 extends across active region AR from a location EG1 on a first edge of active region AR to a location EG2 on a second edge of active region AR opposite the first edge, with poly regions P1, P2, P6, and P7 positioned outside of active region AR. In the embodiment depicted in FIG. 2A, poly regions P3-P5 are positioned inside of active region AR, and, in the embodiment depicted in FIG. 3A, poly regions P3-P5B are positioned inside of active region AR.

Poly regions P3-P5 or P3-P5B inside of active region AR collectively correspond to a portion of the gate structure that overlies the active area corresponding to active region AR. In some embodiments, poly regions P3-P5 or P3-P5B collectively correspond to a portion of the gate structure that overlies a channel of transistor TX.

Each of poly regions P2 and P6 corresponds to a portion of the gate structure, also referred to as a gate extension, that overlies one or more isolation regions (not shown) adjacent to the active area corresponding to active region AR. In some embodiments, a gate extension corresponds to a portion of the gate structure configured to enhance control of the channel of transistor TX.

In some embodiments, poly regions P2-P6 are collectively referred to as a gate region, e.g., a gate region G discussed below with respect to FIGS. 6A-6I, and the portion of the gate structure corresponding to poly regions P2-P6 is referred to as a transistor gate.

Each of poly regions P1 and P7 corresponds to a portion of the gate structure, also referred to as a field poly, that overlies the one or more isolation regions outside of the area corresponding to poly regions P2-P6. In some embodiments, one or both of poly regions P1 or P7 corresponds to some or all of one or more bridges that connect the transistor gate to one or more areas of the gate structure that overlie one or more additional active areas (not shown) of the IC device.

Poly region P1 extends distance D1 from a location FP1 to a location EX1. Poly region P2 extends distance D2 from location EX1 to a location EG1 corresponding to a first edge of active region AR. Poly region P3 extends distance D3 from location EG1 to a location L1 corresponding to the center of gate via VG1. Poly region P4 extends distance D4 from location L1 to a predetermined location T.

In the embodiment depicted in FIG. 2A, poly region P5 extends distance D5 from location T to a location EG2 corresponding to a second edge of active region AR opposite the first edge of active region AR. In the embodiment depicted in FIG. 3A, poly region P5A extends distance D5A from location T to a location L2 corresponding to the center of gate via VG2, and poly region P5B extends distance D5B from location EG2. Poly region P6 extends distance D6 from location EG2 to a location EX2, and poly region P7 extends distance D7 from location EX2 to a location FP2.

Width W is defined from a first end at location EX1 to a second end at location EX2 and is equal to a sum of distances D2-D6. In the embodiment depicted in FIG. 2A, width W includes distance D5, and, in the embodiment depicted in FIG. 3A, width W instead includes distances D5A and D5B. In some embodiments, width W corresponds to a width of the gate of transistor TX. In the embodiments depicted in FIGS. 2A and 3A, width W extends along direction Y. In some embodiments, width W extends along direction X.

Distance D8 is equal to a sum of distances D4-D6. In the embodiment depicted in FIG. 2A, distance D8 includes distance D5, and, in the embodiment depicted in FIG. 3A, distance D8 instead includes distances D5A and D5B. In the embodiment depicted in FIG. 3A, distance D9 is equal to a sum of distances D5B and D6.

In various embodiments, plurality of poly regions P1-P7 does not include one or both of poly regions P1 or P7. In some embodiments, plurality of poly regions P1-P7 does not include poly region P2, and width W is defined by locations EG1 and EX2 and thereby equal to a sum of distances D3-D6. In some embodiments, plurality of poly regions P1-P7 does not include poly region P6, and each of width W and distances D8 and D9 are defined based on location EG2 instead of location EX2; width W is thereby equal to a sum of distances D2-D5 or D2-D5B, distance D8 is thereby equal to a sum of distances D4 and D5 or D4-D5B, and distance D9 is thereby equal to distance DB5. In some embodiments, plurality of poly regions P1-P7 does not include both of poly regions P2 and P6, and width W and distances D8 and D9 are defined based on location EG2 instead of location EX2; width W is thereby equal to a sum of distances D3-D5 or D3-D5B, distance D8 is thereby equal to a sum of distances D4 and D5 or D4-D5B, and distance D9 is thereby equal to distance DB5.

Location T is positioned at a center of width W, such that a sum of distances D2-D4 is equal to a sum of distances D5 and D6 in the embodiment depicted in FIG. 2A or a sum of distances D5A-D6 in the embodiment depicted in FIG. 3A. In various embodiments, location T is positioned along width W such that the sum of distances D2-D4 is less than or greater than the sum of distances D5 and D6 in the embodiment depicted in FIG. 2A or the sum of distances D5A-D6 in the embodiment depicted in FIG. 3A. In some embodiments, location T being positioned other than at the center of width W corresponds to plurality of poly regions P1-P7 not including one of poly regions P2 or P6.

FIG. 2B depicts gate resistance models 200M1 and 200M2, and FIG. 3B depicts gate resistance models 300M1 and 300M2. Each of gate resistance models 200M1 and 200M2 is a schematic representation of a netlist corresponding to IC layout diagram 200L, and each of gate resistance models 300M1 and 300M2 is a schematic representation of a netlist corresponding to IC layout diagram 300L.

Each of gate resistance models 200M1, 200M2, 300M1, and 300M2 includes a gate terminal node NT corresponding to location T, transistor TX, and resistors RVG1, RP4, RP6, and RP7 representing resistance values of gate via VG1 and poly regions P4, P6, and P7, respectively. Each of gate resistance models 200M1 and 200M2 includes a resistor RP5 representing a resistance value of poly region P5, and each of gate resistance models 300M1 and 300M2 includes resistors RVG2, RP5A, and RP5B representing resistance values of gate via VG2 and poly regions P5A and P5B, respectively.

Each of gate resistance models 200M2 and 300M2 differs from respective gate resistance model 200M1 or 300M1 by including a gate terminal node ND at location T and resistor Rdelta coupled between gate terminal nodes ND and NT. As discussed below, the addition of gate terminal node ND and resistor Rdelta to a gate resistance model of an IC layout diagram, e.g., gate resistance model 200M1 of IC layout diagram 200L or gate resistance model 300M1 of IC layout diagram 300L, enables the resultant gate resistance model, e.g., respective gate resistance model 200M2 or 300M2, and the corresponding netlist, to provide an increased gate resistance value while retaining the fundamental structure of the gate resistance model.

For modeling purposes, gate terminal node NT in gate resistance models 200M1, 200M2, 300M1, and 300M2 and gate terminal node ND in gate resistance models 200M2 and 300M2 allow the single location T to represent the distributed, voltage-based gate control function of transistor TX, thereby simplifying the netlist corresponding to the respective IC layout diagram 200L or 300L.

Gate resistance models 200M2 and 300M2, each including gate terminal node ND and resistor Rdelta, are based on the configurations of respective gate resistance models 200M1 and 300M1 and, in operation, are used in place of respective gate resistance models 200M1 and 300M1 when a second gate resistance value is greater than a first gate resistance value, as discussed below with respect to operation 150.

The number and positioning of gate via VG1 or gate vias VG1 and VG2 depicted in FIGS. 2A and 3A, and modeled in FIGS. 2B and 3B, respectively, are non-limiting examples used for the purpose of illustration. In various embodiments, an IC device layout includes one or more gate vias positioned along a width of a gate at one or more locations other than those depicted in FIGS. 2A and 3A. In such embodiments, gate resistance models are derived from the corresponding layouts in a manner similar to that depicted in FIGS. 2B and 3B, and used to determine gate resistance values accordingly. Non-limiting examples of gate resistance models derived from IC device layouts (not shown) other than those depicted in FIGS. 2A and 3A are provided at FIGS. 5A, 5B, 6B, and 6D-6I, each discussed below.

At operation 110, in some embodiments, a resistance value reference is generated. The resistance value reference is an electronic file or database containing a plurality of modelled gate resistance values corresponding to one or more gate via locations along a width of a gate region. Generating the resistance value reference includes one or both of generating or modifying the electronic file or saving resistance values in the database, in various embodiments. In some embodiments, generating the resistance value reference includes storing the plurality of resistance values in a non-transitory storage medium, e.g., a storage medium 704 of IC device design system 700, discussed below with respect to FIG. 7.

Generating the resistance value reference includes determining the plurality of resistance values based on the one or more gate via locations along the width. In some embodiments, the plurality of resistance values further corresponds to a plurality of values other than gate via positions, e.g., a number of fins in a FinFET or a number of gate vias positioned along the width.

In some embodiments, generating the resistance value reference includes determining one or more effective resistance values based on an alternating current (AC) model of the gate region. The AC model includes an AC signal capable of propagating, at least partially, through a dielectric layer of the corresponding gate structure, represented as a capacitance and/or a transconductance of the corresponding transistor.

In some embodiments, the AC model includes a small AC signal, e.g., a signal having an amplitude one or more orders of magnitude below a threshold voltage of the corresponding transistor, applied to a gate structure represented as a lumped resistance, a distributed resistance, or a combination thereof. In various embodiments, the small AC signal corresponds to a carrier signal, a data signal, a noise signal, or a combination thereof.

In some embodiments, generating the resistance value reference includes determining one or more effective resistance values by applying the AC model to gate via positions included in an IC layout diagram, e.g., IC layout diagram 2001 or 3001.

In some embodiments, determining one or more effective resistance values includes one or both of applying a method discussed in U.S. patent application Ser. No. 16/294,735 and/or applying a distributed resistance model found in Razavi, B., Yan, R., and Lee, K. F. "*Impact of Distributed Gate Resistance on the Performance of MOS Devices*" IEEE Transactions on Circuits and Systems-I: Fundamental Theory and Applications, Vol. 41, No. II, pages 750-754 (November 1994, hereinafter "Razavi"), the entireties of each of which are hereby incorporated by reference.

In some embodiments, generating the resistance value reference includes generating a resistance table, e.g., a gate resistance table 400 discussed below with respect to FIG. 4. In some embodiments, generating the resistance table includes organizing the plurality of resistance values so as to be accessible through one or more indices. In various embodiments, at least one of the one or more indices corresponds to a gate region dimension, e.g., a positioning of a gate via along a gate width.

FIG. 4 depicts gate resistance table 400, in accordance with some embodiments. In various embodiments, gate resistance table 400 represents an electronic file or a plurality of database entries. In some embodiments, generating the resistance value reference includes generating gate resistance table 400.

Gate resistance table 400 includes a plurality of resistance values Fmnl corresponding to a gate model, e.g., an AC model, applied to a plurality of gate via configurations, e.g., gate via configurations corresponding to IC layout diagram 200L and/or IC layout diagram 300L. In some embodiments, applying the gate model includes using a TCAD tool to generate or modify gate resistance table 400.

Gate resistance table 400 includes three indices I1[$m$], I2[$n$], and I3[$l$], discussed below, configured to facilitate retrieving gate resistance values based on gate via configuration information, e.g., one or more gate via positions along a width. In some embodiments, determining a second gate resistance value, discussed below with respect to operation 140, includes retrieving a gate resistance value from gate resistance table 400 using one or more of indices I1[$m$], I2[$n$], or I3[$l$].

Gate resistance table 400 includes sub-tables 400-1 . . . 400-L, each of which includes a subset of resistance values Fmnl. The letters m, n, and 1 correspond to values of respective indices I1[$m$]: ($1 \leq m \leq M$), I2[$n$]: ($1 \leq n \leq N$), and I3[$l$]: ($1 \leq l \leq L$) such that sub-table 400-1 includes resistance values corresponding to index value I3[1], sub-table 400-2 includes resistance values corresponding to index value I3[2], and sub-table 400-L includes resistance values corresponding to index value I3[L].

Each of sub-tables 400-1 . . . 400-L depicts index I1[$m$] along a top row and index I2[$n$] along a leftmost column, thereby arranging the relevant resistance values as columns corresponding to values of index I1[$m$] and rows corresponding to values of index I2[$n$]. Accordingly, each of sub-tables 400-1 . . . 400-L includes N rows of resistance values.

In sub-table 400-1, the first row includes resistance values F111-FM11 corresponding to index I1[$m$] having values ranging from m=1 to M, index I2[$n$] having the value n=1, and index I3[$l$] having the value l=1. The second row includes resistance values F121-FM21 corresponding to index I1[$m$] having values ranging from m=1 to M, index I2[$n$] having the value n=2, and index I3[$l$] having the value l=1. The Nth row includes resistance values F1N1-FMN1 corresponding to index I1[$m$] having values ranging from m=1 to M, index I2[$n$] having the value n=N, and index I3[$l$] having the value l=1.

In sub-table 400-2, the first row includes resistance values F112-FM12 corresponding to index I1[$m$] having values ranging from m=1 to M, index I2[$n$] having the value n=1, and index I3[$l$] having the value l=2. The second row includes resistance values F122-FM22 corresponding to index I1[$m$] having values ranging from m=1 to M, index I2[$n$] having the value n=2, and index I3[$l$] having the value l=2. The Nth row includes resistance values F1N2-FMN2 corresponding to index I1[$m$] having values ranging from m=1 to M, index I2[$n$] having the value n=N, and index I3[$l$] having the value l=2.

In sub-table 400-L, the first row includes resistance values F11L-FM1L corresponding to index I1[$m$] having values ranging from m=1 to M, index I2[$n$] having the value n=1, and index I3[$l$] having the value l=L. The second row includes resistance values F12L-FM2L corresponding to index I1[$m$] having values ranging from m=1 to M, index I2[$n$] having the value n=2, and index I3[$l$] having the value l=L. The Nth row includes resistance values F1NL-FMNL corresponding to index I1[$m$] having values ranging from m=1 to M, index I2[$n$] having the value n=N, and index I3[$l$] having the value l=L.

In various embodiments, one or both of indices I1[$m$] or I2[$n$] corresponds to positions of one or more gate vias along a width of a gate region. In various embodiments, one or both of indices I1[$m$] or I2[$n$] corresponds to ratio values based on gate via positions relative to the width.

In some embodiments, index I1[$m$] corresponds to values of a ratio of distance D8 to width W discussed above with respect to FIGS. 2A and 3A. In some embodiments, M=11 and index I1[$m$] has values 0.0, 0.1, 0.2 . . . 1.0 of the ratio of distance D8 to width W.

In some embodiments, index I2[$n$] corresponds to values of a ratio of distance D9 to width W discussed above with respect to FIG. 3A. In some embodiments, N=11 and index I2[$n$] has values 0.0, 0.1, 0.2 . . . 1.0 of the ratio of distance D9 to width W.

In some embodiments, index I1[$m$] and index I2[$n$] having a same value corresponds to the embodiment depicted in FIG. 2A, in which the IC device includes a single gate via VG1, and index I1[$m$] and index I2[$n$] having differing values corresponds to the embodiment depicted in FIG. 3A, in which the IC device includes gate vias VG1 and VG2.

In some embodiments, index I3[$l$] corresponds to numbers of fins of a FinFET corresponding to active region AR discussed above with respect to FIGS. 2A and 3A. In some embodiments, L=5 and index I3[*l*] has values 2 . . . 6 of numbers of fins of the FinFET corresponding to active region AR. In some embodiments, index I3[*l*] corresponds to numbers of gate vias positioned along width W.

In various embodiments, index I1[*m*] includes the number of index values M less than or greater than 11, index I2[*n*] includes the number of index values N less than or greater than 11, and/or index I3[*l*] includes the number of index values L less than or greater than five.

In the embodiment depicted in FIG. 4, each of sub-tables 400-1 . . . 400-L has a same format. In various embodiments, one or more sub-tables of sub-tables 400-1 . . . 400-L have a format that differs from that of one or more other sub-tables of sub-tables 400-1 . . . 400-L. In some embodiments, one or more sub-tables of sub-tables 400-1 . . . 400-L has fewer or more than two indices. In some embodiments, a number of indices corresponding to a given sub-table of sub-tables 400-1 . . . 400-L varies with respect to the number of gate vias positioned along a gate width, e.g., width W discussed above with respect to FIGS. 2A and 3A.

In some embodiments, resistance values Fmnl correspond to absolute resistance values. In some embodiments, resistance values Fmnl correspond to relative resistance values, e.g., resistance factors representing fractions of an effective gate resistance corresponding to a gate region.

At operation 120, dimensions of a gate region of the IC device are extracted. The dimensions include a width of the gate region and a distance from a first end of the width to a gate via positioned along the width. The width extends at least from a first edge of an active region to a second edge of the active region. In various embodiments, the width extends beyond one or both of the first or second edges of the active region. In some embodiments, the IC device includes one or more vias in addition to the gate via, and the dimensions include one or more additional distances from the first end of the width to the one or more additional gate vias positioned along the width.

In some embodiments, extracting the dimensions includes extracting the dimensions from an IC layout diagram and/or a netlist of the IC device. In some embodiments, extracting the dimensions includes receiving the IC layout diagram and/or netlist.

In some embodiments, extracting the dimensions includes receiving IC device information other than an IC layout diagram or netlist from which the dimensions are capable of being extracted. In various embodiments, extracting the dimensions includes performing one or more operations on received information or receiving the dimensions without performing an additional operation.

In some embodiments, extracting the dimensions includes extracting width W and distance D8 from IC layout diagram 200L or 300L discussed above with respect to FIGS. 2A and 3A. In some embodiments, extracting the dimensions further includes extracting distance D9 from IC layout diagram 300L.

At operation 130, a first gate resistance value corresponding to the gate region is received. The first gate resistance value is based on a positioning of the gate via along the width. In some embodiments, the first gate resistance value is further based on a positioning of one or more additional gate vias along the width.

In some embodiments, receiving the first gate resistance value includes receiving the first gate resistance value based on a direct current (DC) model of the gate region. The DC model includes a DC signal capable of maintaining an electric field across the dielectric layer of the corresponding gate structure, represented as the capacitance and/or transconductance of the corresponding transistor.

In some embodiments, the DC model includes the DC signal e.g., a signal having an amplitude on the same order of magnitude as a threshold voltage corresponding to the IC device, applied to a gate structure represented as a lumped resistance, a distributed resistance, or a combination thereof. In various embodiments, the DC signal corresponds to a logic signal, a data signal, a bias signal, or a combination thereof. In some embodiments, receiving the first gate resistance value includes receiving the first gate resistance value based on the DC signal having a uniform voltage distribution along the width.

In some embodiments, receiving the first gate resistance value includes receiving the netlist of the IC device. In some embodiments, receiving the first gate resistance value includes receiving one or more resistance values of one or more of RVG1, RVG2, RP4, RP5, RP5A, RP5B, RP6, or RP7, discussed above with respect to FIGS. 2B and 3B. In some embodiments, receiving the first gate resistance value includes receiving the first gate resistance value based on one or more of gate resistance models 500A-600I, discussed below with respect to FIGS. 5A-6I.

In some embodiments, receiving the first gate resistance value includes receiving the first gate resistance value from an application executed on an IC device design system, e.g., IC device design system 700 discussed below with respect to FIG. 7. In some embodiments, receiving the first gate resistance value includes determining the first gate resistance value by executing an application on an IC device design system, e.g., IC device design system 700.

Figure 5A:
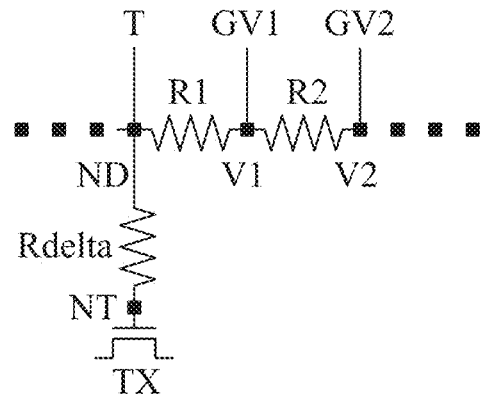
FIGS. 5A and 5B depict gate resistance models, in accordance with some embodiments.
Figure 5B:
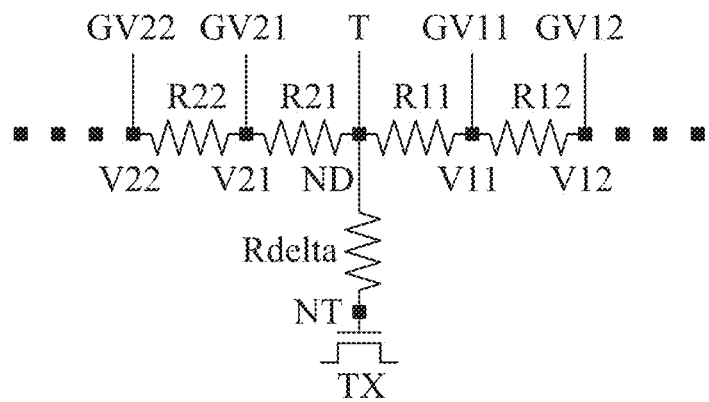

FIGS. 5A and 5B depict respective gate resistance models 500A and 500B, in accordance with some embodiments. Gate resistance models 500A and 500B are non-limiting examples of gate resistance models usable to determine the first gate resistance value by assuming the uniform voltage distribution.

Each of gate resistance models 500A and 500B includes transistor TX, resistor Rdelta, and gate terminal nodes ND and NT corresponding to location T, each discussed above and below with respect to FIGS. 2A and 3A.

Gate resistance model 500A includes gate vias GV1 and GV2 and resistors R1 and R2, and gate resistance model 500B includes gate vias GV11, GV12, GV21, and GV22 and resistors R11, R12, R21, and R22. Gate vias GV1, GV2, GV11, GV12, GV21, and GV22 represent locations at which gate vias contact the gate of transistor TX and therefore do not include representations of gate via resistances.

In gate resistance model 500A, resistor R1 represents the resistance of a gate portion between gate via GV1 and location T, and resistor R2 represents the resistance of a gate portion between gate vias GV1 and GV2. Voltage V1 represents a voltage level at gate via GV1, and voltage V2 represents a voltage level at gate via GV2.

In a case in which the gate of transistor TX is electrically connected solely through gate via GV1, gate resistance model 500A provides the first gate resistance value between gate via GV1 and location T, represented by gate terminal node ND, equal to resistor R1. By assuming a uniform voltage distribution across the gate of transistor TX, voltages V1 and V2 have a same voltage level. In a case in which the gate of transistor TX is electrically connected through both of gate vias GV1 and GV2, voltages V1 and V2 having the same voltage level causes resistor R2 to be ignored, and gate resistance model 500A thereby provides the first gate resistance value between gate via GV1 and location T equal to resistor R1.

Based on the uniform voltage distribution, in cases in which transistor TX is electrically connected through one or more gate vias (not shown) in addition to gate vias GV1 and GV2 and further from location T than gate via GV1, gate resistance model 500A similarly ignores the corresponding resistors and provides the first gate resistance value equal to resistor R1.

Because gate resistance model 500A provides the first gate resistance value equal to resistor R1, a case in which gate via GV1 is positioned at location T causes resistor R1 to have a value of zero, and gate model 500A to provide the first gate resistance value equal to zero.

In gate resistance model 500B, resistor R11 represents the resistance of a gate portion between gate via GV11 and location T, resistor R12 represents the resistance of a gate portion between gate vias GV11 and GV12, resistor R21 represents the resistance of a gate portion between gate via GV21 and location T, and resistor R22 represents the resistance of a gate portion between gate vias GV21 and GV22. Voltage V11 represents a voltage level at gate via GV11, voltage V12 represents a voltage level at gate via GV12, voltage V21 represents a voltage level at gate via GV21, and voltage V22 represents a voltage level at gate via GV22.

Because gate vias GV11 and GV12 and resistors R11 and R12 have the same configuration as that of gate vias GV1 and GV2 and resistors R1 and R2 relative to location T, by assuming a uniform voltage distribution that includes voltages V11 and V12, gate resistance model 500B provides resistor R11 as a resistance value of an electrical connection through gate via GV11 in combination with gate via GV12 and any additional gate vias (not shown) further from location T than gate via GV11.

Similarly, because gate vias GV21 and GV22 and resistors R21 and R22 have the same configuration as that of gate vias GV1 and GV2 and resistors R1 and R2 relative to location T, by assuming a uniform voltage distribution that includes voltages V21 and V22, gate resistance model 500B provides resistor R21 as a resistance value of an electrical connection through gate via GV21 in combination with gate via GV22 and any additional gate vias (not shown) further from location T than gate via GV21.

In cases in which the gate of transistor TX is electrically connected through gate vias GV11 and GV21, gate resistance model 500B thereby provides the first gate resistance value equal to a parallel combination of resistors R11 and R21. Such cases include those in which the gate of transistor TX is further electrically connected through one or more of gate vias GV12, GV22, or any additional gate vias further from location T than corresponding gate via GV11 or GV21.

In cases in which either of gate vias GV11 or GV21 is positioned at location T, the corresponding one of resistor R11 or R21 has a value of zero, and gate model 500B thereby provides the first gate resistance value equal to zero.

At operation 140, a second gate resistance value is determined. In various embodiments, determining the second gate resistance value includes performing one or more calculations based on the gate region dimensions, retrieving second gate resistance value information from the resistance value reference, e.g., gate resistance table 400 discussed above with respect to FIG. 4, or a combination thereof.

In various embodiments, determining the second gate resistance value is based on applying an AC model to an IC layout diagram, e.g., IC layout diagram 200L or 300L, discussed above with respect to FIGS. 2A and 3A. In some embodiments, determining the second gate resistance value is based on one or more of gate resistance models 600A-600I, discussed below with respect to FIGS. 6A-6I.

The second gate resistance value is based on the gate region dimensions including the gate region width and a positioning of the gate via along the width, e.g., as defined by the distance from the first end of the width to the gate via. In some embodiments, the second gate resistance value is further based on one or more positionings of one or more additional gate vias along the width, e.g., as defined by one or more additional distances from the first end of the width to the one or more additional gate vias.

Determining the second gate resistance value includes the second gate resistance value being greater than the first gate resistance value or the second gate resistance value being equal to or less than the first gate resistance value.

In some embodiments in which determining the second gate resistance value includes performing one or more calculations based on the gate region dimensions, determining the second gate resistance value is performed in the manner of determining one or more effective resistance values discussed above with respect to generating the resistance value reference in operation 110.

In some embodiments in which determining the second gate resistance value includes retrieving the second gate resistance value from the resistance value reference, determining the second gate resistance value includes retrieving the second gate resistance value from at least one of a file or a database. In some embodiments, determining the second gate resistance value includes retrieving the second gate resistance value from gate resistance table 400 discussed above with respect to FIG. 4.

In some embodiments, retrieving the second gate resistance value from the table includes accessing the table using one or more indices, e.g., one or more of indices $I1[m]$, $I2[n]$, or $I3[l]$ discussed above with respect to FIG. 4. In some embodiments, using the index includes calculating the ratio of the distance to the width, the distance being defined from the first edge of the width to a given gate via along the width. In some embodiments, using the index includes accessing the table using one or both of distances D8 or D9 and width W discussed above with respect to FIGS. 2A and 3A. In various embodiments, using the index includes generating an index value corresponding to a fin number and/or a number of gate vias.

In some embodiments, determining the second gate resistance value includes retrieving an absolute resistance value. In some embodiments, determining the second gate resistance value includes retrieving a resistance factor and applying the resistance factor to a resistance value, e.g., by dividing an effective gate resistance value by a retrieved resistance factor.

In some embodiments, determining the second gate resistance value includes selecting a gate via from a plurality of gate vias based on the gate via being closer to a predetermined location, e.g., a center of the width, than another gate via of the plurality of gate vias. In some embodiments, determining the second gate resistance value includes selecting first and second gate vias based on the first and second gate vias being the gate vias of the plurality of gate vias closest to the predetermined location. In some embodiments, determining the second gate resistance value includes selecting first and second gate vias based on the first gate via being the gate via of the plurality of gate vias closest to the predetermined location in a first direction, and the second gate via being the gate via of the plurality of gate vias closest to the predetermined location in a second direction opposite the first direction. In some embodiments, the predetermined location is location T discussed above with respect to FIGS. 2A-3B, 5A and 5B, and below with respect to FIGS. 6A-6I.

FIGS. 6A-6I depict respective gate resistance models 600A-600I, in accordance with some embodiments. Gate resistance models 600A-600I are non-limiting examples of gate resistance models usable to determine the second gate resistance value being greater than the first gate resistance value or the second gate resistance value being equal to or less than the first gate resistance value. Each of gate resistance models 600A-600I corresponds to a netlist and is based on an IC device configuration that includes one or more of gate vias GV1-GV6. The gate via configurations are similar to those depicted in IC layout diagrams 200L and 300L discussed above with respect to FIGS. 2A and 3A, and corresponding IC layout diagrams are not depicted for the purpose of simplicity.

Each of gate resistance models 600A-600I includes a gate region G corresponding to poly regions P2-P6, collectively, and location T, discussed above with respect to FIGS. 2A-3B, 5A, and 5B, and gate via GV1 and resistor R1 discussed above with respect to FIGS. 5A and 5B. In addition to gate region G, location T, gate via GV1, and resistor R1, each of gate resistance models 600B-600I includes one or more of gate vias GV2-GV6 and/or resistors R2-R6.

In the manner discussed above with respect to FIGS. 5A and 5B, each of gate vias GV1-GV6 represents a location at which a gate via contacts gate region G and therefore does not include a representation of a gate via resistance. Each of resistors R1-R6 represents the resistance of the gate portion between a respective gate via GV1-GV6 and an adjacent gate via or location T.

As discussed below, each of gate resistance models 600A-600I corresponds to the first gate resistance value provided by gate resistance model 500A or 500B, discussed above with respect to FIGS. 5A and 5B, and the second gate resistance value determined from gate resistance table 400, discussed above with respect to FIG. 4, based on positioning of one or more of gate vias GV1-GV6 along gate region G. In some embodiments, one or more indices used to access gate resistance table 400 are based on one or both of distances D8 and D9 and width W discussed above with respect to FIGS. 2A and 3A.

Figure 6A:
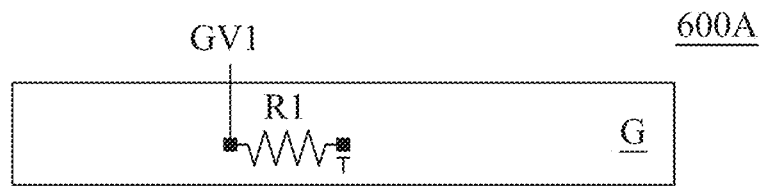
FIGS. 6A-6I depict gate resistance models, in accordance with some embodiments.

In FIG. 6A, gate resistance model 600A includes gate region G electrically connected solely through gate via GV1. The first gate resistance value is thereby provided as resistor R1, and the second gate resistance value is determined by generating an index value based on positioning of gate via GV1 relative to a width of gate region G. In some embodiments, gate via GV1 corresponds to distance D8, and the value of index I1[$m$] is based on the ratio of distance D8 to width W.

Figure 6B:
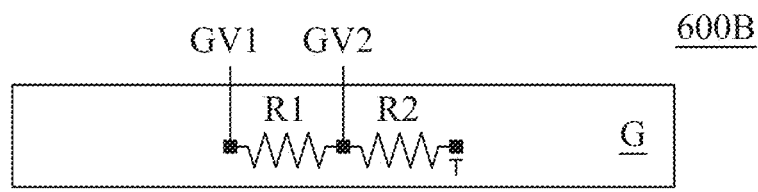

In FIG. 6B, gate resistance model 600B includes gate region G electrically connected through gate vias GV1 and GV2, with gate via GV2 positioned between gate via GV1 and location T. The first gate resistance value is thereby provided as resistor R2, and the second gate resistance value is determined by generating index values based on positioning of each of gate vias GV1 and GV2 relative to the width of gate region G. In some embodiments, one of gate vias GV1 or GV2 corresponds to distance D8, the value of index I1[$m$] is based on the ratio of distance D8 to width W, the other of gate vias GV1 or GV2 corresponds to distance D9, and the value of index I2[$n$] is based on the ratio of distance D9 to width W.

Figure 6C:
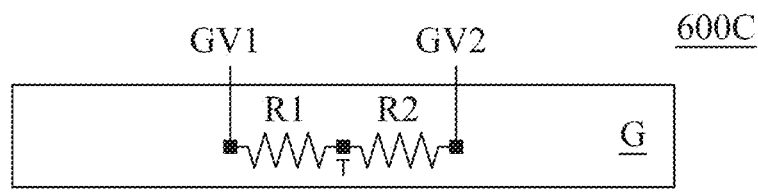

In FIG. 6C, gate resistance model 600C includes gate region G electrically connected through gate vias GV1 and GV2, with location T positioned between gate vias GV1 and GV2. The first gate resistance value is thereby provided as resistor R1 in parallel with resistor R2, and the second gate resistance value is determined by generating index values based on positioning of each of gate vias GV1 and GV2 relative to the width of gate region G. In some embodiments, one of gate vias GV1 or GV2 corresponds to distance D8, the value of index I1[$m$] is based on the ratio of distance D8 to width W, the other of gate vias GV1 or GV2 corresponds to distance D9, and the value of index I2[$n$] is based on the ratio of distance D9 to width W.

Figure 6D:
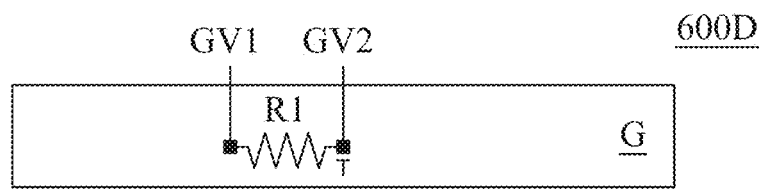

In FIG. 6D, gate resistance model 600D includes gate region G electrically connected through gate vias GV1 and GV2, with gate via GV2 positioned at location T. The first gate resistance value is thereby provided as zero, and the second gate resistance value is determined by generating index values based on positioning of each of gate vias GV1 and GV2 relative to the width of gate region G. In some embodiments, one of gate vias GV1 or GV2 corresponds to distance D8, the value of index I1[$m$] is based on the ratio of distance D8 to width W, the other of gate vias GV1 or GV2 corresponds to distance D9, and the value of index I2[$n$] is based on the ratio of distance D9 to width W.

Figure 6E:
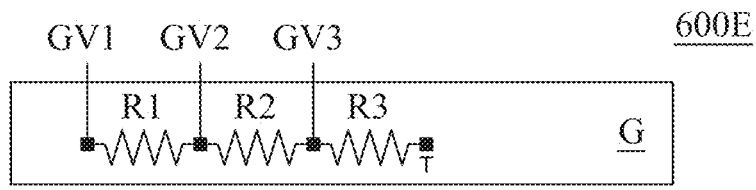

In FIG. 6E, gate resistance model 600E includes gate region G electrically connected through gate vias GV1-GV3, with gate via GV2 positioned between gate vias GV1 and GV3, and gate via GV3 positioned between gate via GV2 and location T. The first gate resistance value is thereby provided as resistor R3. By selecting gate vias GV2 and GV3 as the gate vias closest to location T, the second gate resistance value is determined by generating index values based on positioning of each of gate vias GV2 and GV3 relative to the width of gate region G. In some embodiments, one of gate vias GV2 or GV3 corresponds to distance D8, the value of index I1[$m$] is based on the ratio of distance D8 to width W, the other of gate vias GV2 or GV3 corresponds to distance D9, and the value of index I2[$n$] is based on the ratio of distance D9 to width W.

Figure 6F:
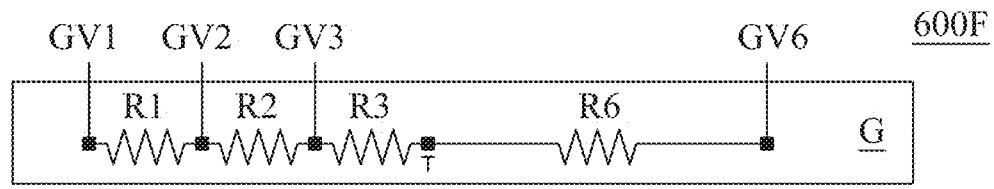

In FIG. 6F, gate resistance model 600F includes gate region G electrically connected through gate vias GV1-GV3 and GV6, with gate via GV2 positioned between gate vias GV1 and GV3, gate via GV3 positioned between gate via GV2 and location T, and location T positioned between gate vias GV3 and GV6. The first gate resistance value is thereby provided as resistor R3 in parallel with resistor R6. By selecting gate via GV3 as the gate via closest to location T on the left side of location T, and gate via GV6 as the gate via closest to location T on the right side of location T, the second gate resistance value is determined by generating index values based on positioning of each of gate vias GV3 and GV6 relative to the width of gate region G. In some embodiments, one of gate vias GV3 or GV6 corresponds to distance D8, the value of index I1[$m$] is based on the ratio of distance D8 to width W, the other of gate vias GV3 or GV6 corresponds to distance D9, and the value of index I2[$n$] is based on the ratio of distance D9 to width W.

Figure 6G:
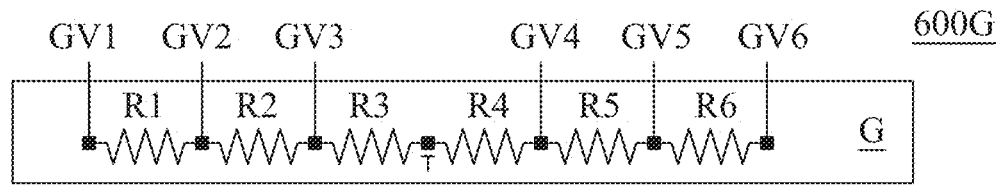

In FIG. 6G, gate resistance model 600G includes gate region G electrically connected through gate vias GV1-GV6, with gate via GV2 positioned between gate vias GV1 and GV3, gate via GV3 positioned between gate via GV2 and location T, location T positioned between gate vias GV3 and GV4, gate via GV4 positioned between location T and gate via GV5, and gate via GV5 positioned between gate vias GV4 and GV6. The first gate resistance value is thereby provided as resistor R3 in parallel with resistor R4. By selecting gate via GV3 as the gate via closest to location T on the left side of location T, and gate via GV4 as the gate via closest to location T on the right side of location T, the second gate resistance value is determined by generating index values based on positioning of each of gate vias GV3 and GV4 relative to the width of gate region G. In some embodiments, one of gate vias GV3 or GV4 corresponds to distance D8, the value of index I1[m] is based on the ratio of distance D8 to width W, the other of gate vias GV3 or GV4 corresponds to distance D9, and the value of index I2[n] is based on the ratio of distance D9 to width W.

Figure 6H:
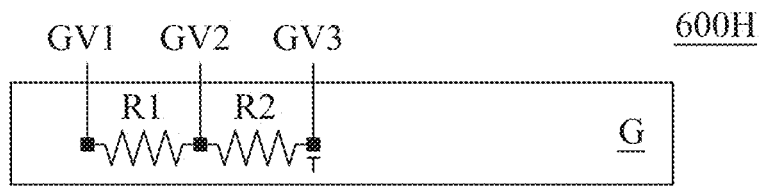

In FIG. 6H, gate resistance model 600H includes gate region G electrically connected through gate vias GV1-GV3, with gate via GV2 positioned between gate vias GV1 and GV3, and gate via GV3 positioned at location T. The first gate resistance value is thereby provided as zero. By selecting gate vias GV2 and GV3 as the gate vias closest to location T, the second gate resistance value is determined by generating index values based on positioning of each of gate vias GV2 and GV3 relative to the width of gate region G. In some embodiments, one of gate vias GV2 or GV3 corresponds to distance D8, the value of index I1[m] is based on the ratio of distance D8 to width W, the other of gate vias GV2 or GV3 corresponds to distance D9, and the value of index I2[n] is based on the ratio of distance D9 to width W.

Figure 6I:
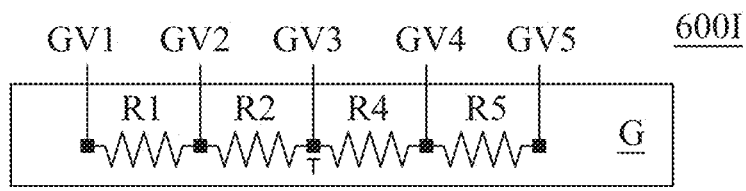

In FIG. 6I, gate resistance model 600I includes gate region G electrically connected through gate vias GV1-GV5, with gate via GV2 positioned between gate vias GV1 and GV3, gate via GV3 positioned at location T, and gate via GV4 positioned between location T and gate via GV5. The first gate resistance value is thereby provided as zero. By selecting gate via GV3 as the gate via closest to location T on either side of location T, and one of gate vias GV2 or GV4 (GV2/GV4) as the gate via closest to location T on the corresponding left or right side of location T, the second gate resistance value is determined by generating index values based on positioning of each of gate vias GV3 and GV2/GV4 relative to the width of gate region G. In some embodiments, one of gate vias GV3 or GV2/GV4 corresponds to distance D8, the value of index I1[m] is based on the ratio of distance D8 to width W, the other of gate vias GV3 or GV2/GV4 corresponds to distance D9, and the value of index I2[n] is based on the ratio of distance D9 to width W.

At operation 150, in some embodiments, the netlist is updated based on the first and second gate resistance values. In some embodiments, updating the netlist includes adding a gate terminal node and a resistor, e.g., gate terminal node ND and resistor Rdelta as discussed above with respect to FIGS. 2B and 3B, to the netlist. The netlist includes a first gate terminal node corresponding to a predetermined location along the width of the gate region, e.g., the center of the width. In some embodiments, the netlist includes gate terminal node NT corresponding to location T along width W in gate resistance model 200M1 or 300M1 discussed above with respect to FIGS. 2B and 3B.

In cases in which the second gate resistance value is equal to or less than the first gate resistance value, updating the netlist includes, in various embodiments, leaving the netlist unchanged, or adding or modifying a netlist status indicator corresponding to determining the second gate resistance value being equal to or less than the first gate resistance value. In various embodiments, in cases in which the second gate resistance value is equal to or less than the first gate resistance value, updating the netlist includes leaving the IC layout diagram unchanged, or adding or modifying an IC layout diagram status indicator corresponding to determining the second gate resistance value being equal to or less than the first gate resistance value.

In cases in which the second gate resistance value is greater than the first gate resistance value, updating the netlist includes adding the second gate terminal node corresponding to the predetermined location, and adding the resistor between the first gate terminal node and the second gate terminal node. The resistor has a resistance value based on the first gate resistance value subtracted from the second gate resistance value.

In some embodiments, the resistor has a resistance value equal to the first gate resistance value subtracted from the second gate resistance value. In such embodiments, adding the resistor to the netlist increases the total gate resistance to a value equal to the second gate resistance value.

In some embodiments, the resistor has a resistance value equal to the first gate resistance value subtracted from the second gate resistance value and combined with another value, e.g., a scaling factor, a weight, or an offset. In such embodiments, adding the resistor to the netlist increases the total gate resistance to a value other than the second gate resistance value, e.g., to compensate for gate vias excluded from the second gate resistance value determination.

In some embodiments, adding the second gate terminal node includes adding gate terminal node ND at location T, and adding the resistor includes adding resistor Rdelta, each discussed above with respect to FIGS. 2B, 3B, 5A, and 5B. In some embodiments, adding resistor Rdelta includes adding Rdelta having a resistance value based on at least one of the first or second gate resistance values determined in accordance with the embodiments depicted in FIGS. 6A-6I. In some embodiments, adding resistor Rdelta includes adding Rdelta having a resistance value equal to the first gate resistance value determined in accordance with the embodiments depicted in FIGS. 6A-6I subtracted from the second gate resistance value determined in accordance with the embodiments depicted in FIGS. 6A-6I.

In some embodiments, adding the second gate terminal node and resistor includes using gate resistance model 200M2 in place of gate resistance model 200M1 discussed above with respect to FIG. 2B. In some embodiments, by using gate resistance model 200M2 in place of gate resistance model 200M1, the effective gate resistance of transistor TX electrically connected through gate via VG1 is increased from the first gate resistance value of RP4 to the second gate resistance value of RP4+Rdelta. Because gate resistance models 200M1 and 200M2 have an equivalent topology for the series of resistors RVG1 through RP7, a modeled DC behavior of IC layout diagram 200L is not altered by using gate resistance model 200M2 in place of gate resistance model 200M1.

In some embodiments, adding the second gate terminal node and resistor includes using gate resistance model 300M2 in place of gate resistance model 300M1, discussed above with respect to FIG. 3B. In some embodiments, by using gate resistance model 300M2 in place of gate resistance model 300M1, the effective gate resistance of transistor TX electrically connected through gate vias VG1 and VG2 is increased from the first gate resistance value of RP4 in parallel with resistor RP5A to the second gate resistance value of (RP4 in parallel with resistor RP5A)+Rdelta. Because gate resistance models 300M1 and 300M2 have an equivalent topology for the resistors RVG1, RVG2, and RP4-RP7, a modeled DC behavior of IC layout diagram 300L is not altered by using gate resistance model 300M2 in place of gate resistance model 300M1.

By conditionally adding the second gate terminal node and resistor, the netlist is updated as needed to include a resistance value based on a model, e.g., an AC model, other than a first model, e.g., a default and/or DC model, of the gate region. In some embodiments, by conditionally adding the second gate terminal node and resistor, the netlist is updated to compensate for cases in which a first model provides a resistance value, e.g., zero, that is below an expected value for the corresponding IC device.

By adding the second gate terminal node and resistor to the first terminal node corresponding to the predetermined location, the netlist is updated without altering the topology used for modeling DC behavior, e.g., in applications in which a transistor is included in a cascade arrangement.

In some embodiments, updating the netlist includes storing the netlist in a storage device. In various embodiments, storing the netlist in the storage device includes storing the netlist in a non-volatile, computer-readable memory or a cell library, e.g., a database, and/or includes storing the netlist over a network. In some embodiments, storing the netlist in the storage device includes storing the netlist using IC device design system 700, discussed below with respect to FIG. 7.

At operation 160, in some embodiments, the first and second gate resistance values are used to determine whether or not the IC layout diagram complies with a design specification. In various embodiments, using the first and second gate resistance values includes using the second gate resistance value greater than the first gate resistance value or using the second gate resistance value equal to or less than the first gate resistance value.

In some embodiments, using the first and second gate resistance values includes using the netlist corresponding to the IC layout diagram. In various embodiments, using the first and second gate resistance values includes using the netlist unaltered or after adding the second gate terminal node and resistor.

In some embodiments, determining whether or not the IC layout diagram complies with the design specification includes performing a simulation based on the IC layout diagram. In some embodiments, performing the simulation includes performing an AC simulation of the IC device corresponding to the IC layout diagram in which the AC simulation uses the resistor. In some embodiments, performing the simulation includes performing a DC simulation of the IC device corresponding to the IC layout diagram in which the DC simulation is independent of the resistor.

In various embodiments, the design specification includes a gain, a speed, a noise performance, a transient response time, a cutoff frequency, or another characteristic of the IC device potentially affected by a gate resistance.

At operation 170, in some embodiments, the IC layout diagram is modified in response to a determination that the IC layout diagram does not comply with the design specification. In various embodiments, modifying the IC layout diagram includes one or more of changing the location of one or more gate vias along the width or including one or more additional gate vias along the width in the IC layout diagram.

In some embodiments, modifying the IC layout diagram includes modifying the netlist corresponding to the IC layout diagram.

At operation 180, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes using IC device design system 700, discussed below with respect to FIG. 7.

At operation 190, in some embodiments, at least one of one or more semiconductor masks or at least one component in a layer of a semiconductor IC is fabricated, or one or more manufacturing operations are performed based on the IC layout diagram. Fabricating one or more semiconductor masks or at least one component in a layer of a semiconductor IC, and performing one or more manufacturing operations, e.g., one or more lithographic exposures, based on the IC layout diagram are discussed below with respect to FIG. 8.

By executing some or all of the operations of method 100, a second modeled gate resistance of an IC device is determined after obtaining a first modeled gate resistance, and used to either verify that the first modeled gate resistance is sufficiently large, or update a netlist to increase the first modeled gate resistance accordingly, thereby improving accuracy and avoiding underestimating gate resistance values compared to gate resistance modeling methods that do not include determining a second modeled gate resistance value.

Because improving accuracy and avoiding underestimating gate resistance values act to reduce the number of IC layout revisions, IC devices are manufactured based on method 100 more efficiently than those manufactured based on methods that do not include determining a second modeled gate resistance value.

Figure 7:
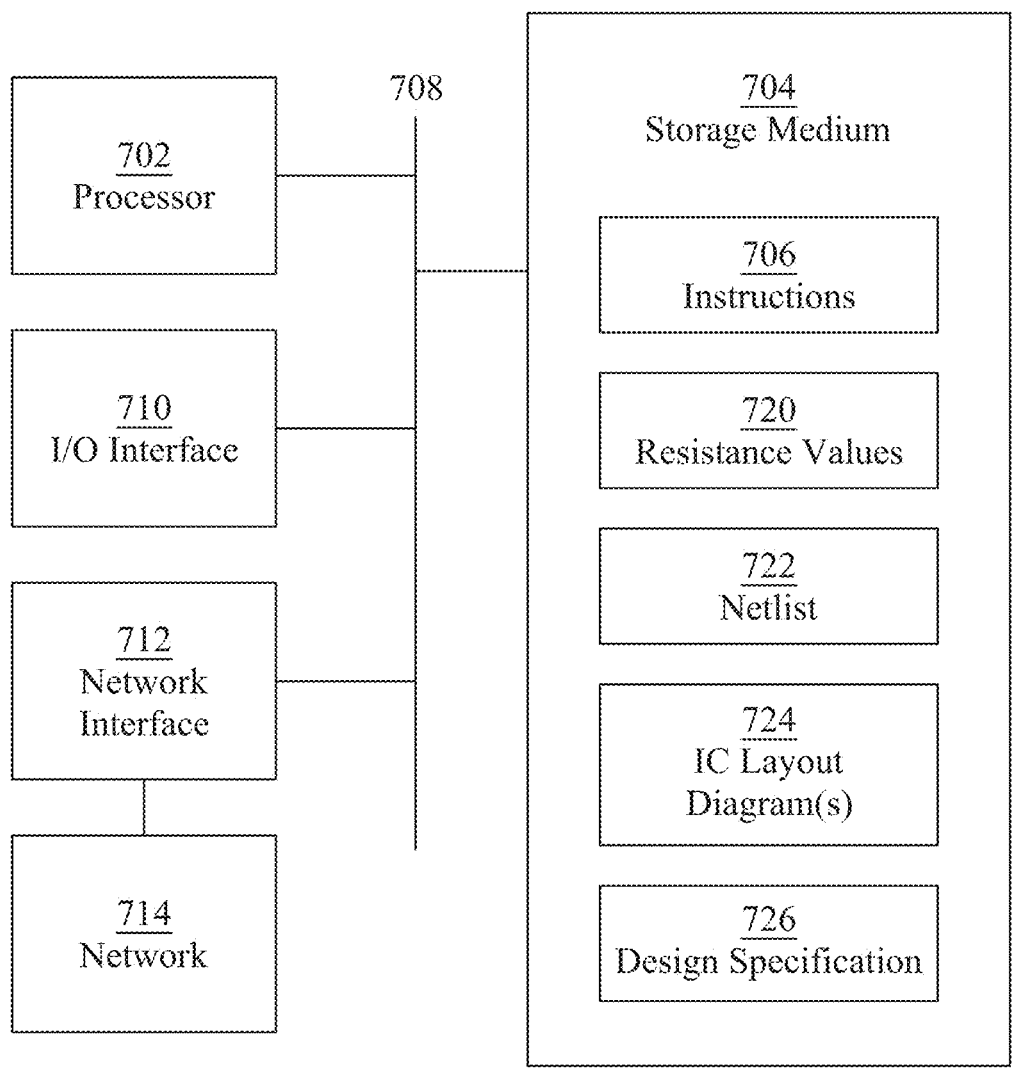
FIG. 7 is a block diagram of an IC device design system, in accordance with some embodiments.

FIG. 7 is a block diagram of IC device design system 700, in accordance with some embodiments. One or more operations of method 100, discussed above with respect to FIG. 1, are implementable using IC device design system 700, in accordance with some embodiments. In some embodiments, IC device design system 700 is an EDA system.

In some embodiments, IC device design system 700 is a computing device including a hardware processor 702 and a non-transitory computer-readable storage medium 704. Non-transitory computer-readable storage medium 704, amongst other things, is encoded with, i.e., stores, computer program code 706, i.e., a set of executable instructions. Execution of instructions 706 by hardware processor 702 represents (at least in part) an IC device design system which implements a portion or all of, e.g., a method 100 discussed above with respect to FIG. 1 (hereinafter, the noted processes and/or methods).

Processor 702 is electrically coupled to non-transitory computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and non-transitory, computer-readable storage medium 704 are capable of connecting to external elements via network 714. Processor 702 is configured to execute computer program code 706 encoded in non-transitory computer-readable storage medium 704 in order to cause IC device design system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, non-transitory computer-readable storage medium 704 is an electronic, magnetic, optical, electromagnetic, infrared, and/or a semiconductor system (or apparatus or device). For example, non-transitory computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 704 includes a compact disk-read only memory (CD-ROM), a compact disk-read/write (CD-R/W), and/or a digital video disc (DVD).

In one or more embodiments, non-transitory computer-readable storage medium 704 stores computer program code 706 configured to cause IC device design system 700 to be usable for performing a portion or all of the noted processes and/or methods. In one or more embodiments, non-transitory computer-readable storage medium 704 also stores information which facilitates performing a portion or all of the noted processes and/or methods. In various embodiments, non-transitory computer-readable storage medium 704 stores one or a combination of at least one resistance value 720, netlist 722, IC layout diagram 724 or at least one design specification 726, each discussed above with respect to method 100 and FIGS. 1-6I.

IC device design system 700 includes I/O interface 710. I/O interface 710 is coupled to external circuitry. In various embodiments, I/O interface 710 includes one or a combination of a keyboard, keypad, mouse, trackball, trackpad, display, touchscreen, and/or cursor direction keys for communicating information and commands to and/or from processor 702.

IC device design system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 700.

IC device design system 700 is configured to receive information through I/O interface 710. The information received through I/O interface 710 includes one or a combination of at least one resistance value, at least one netlist, at least one IC layout diagram, at least one design rule, and/or other parameters for processing by processor 702. The information is transferred to processor 702 via bus 708. IC device design system 700 is configured to transmit and/or receive information related to a user interface through I/O interface 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 100, as discussed above with respect to FIGS. 1-6I, IC device design system 700 and a non-transitory computer-readable recording medium, e.g., non-transitory computer-readable recording medium 704, enable the benefits discussed above with respect to method 100.

Figure 8:
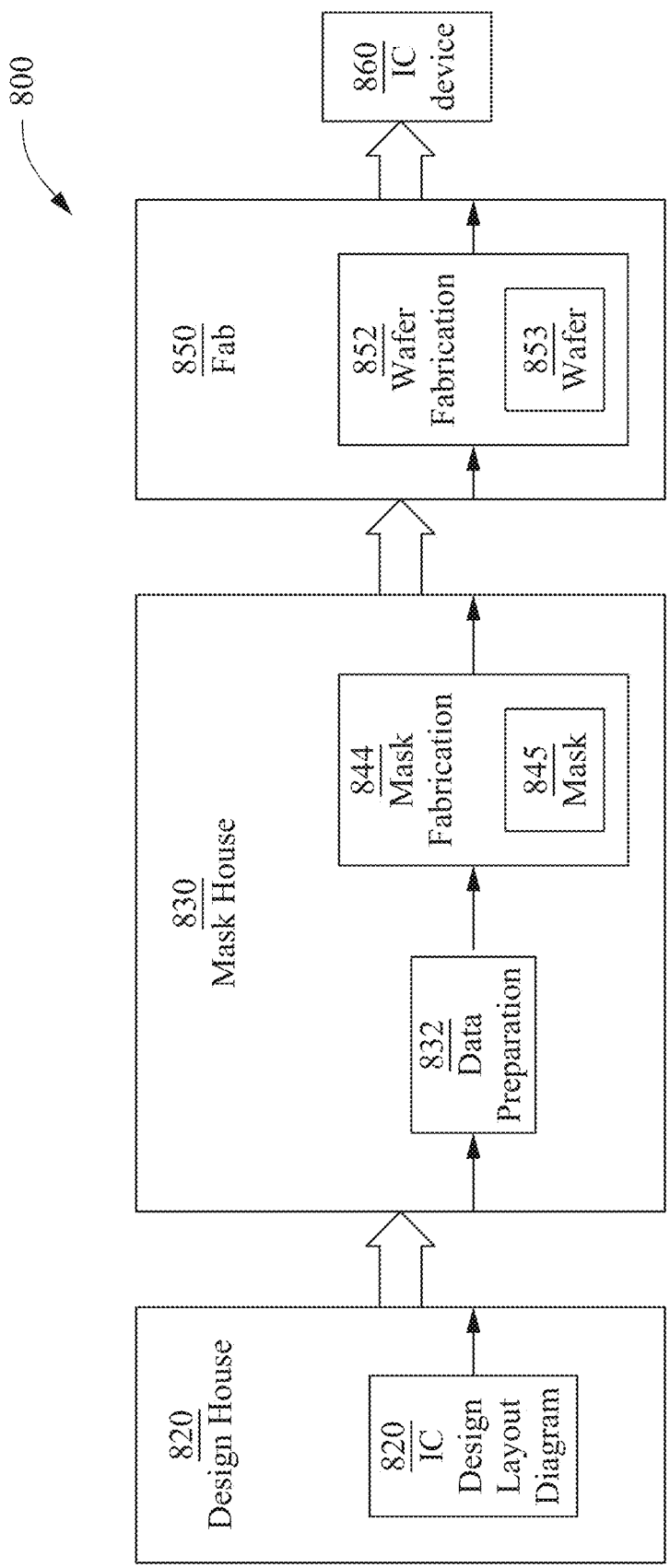
FIG. 8 is a block diagram of an integrated circuit (IC) manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822 based on method 100, discussed above with respect to FIGS. 1-6I. IC design layout diagram 822 includes various geometrical patterns that correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure including method 100, discussed above with respect to FIGS. 1-6, to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 1045 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an IC manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes receiving an IC layout diagram including a gate region and a gate via, the gate via being positioned at a location within an active region and along a width of the gate region extending across the active region, receiving a first gate resistance value of the gate region, retrieving a second gate resistance value from a resistance value reference based on the location and the width, using the first and second resistance values to determine that the IC layout diagram does not comply with a design specification, and based on the non-compliance with the design specification, modifying the IC layout diagram. In some embodiments, receiving the IC layout diagram includes receiving the IC layout diagram comprising a FinFET including the gate region and the gate via, and retrieving the second gate resistance value includes retrieving the second gate resistance value from the resistance value reference using a first index value based on a number of fins of the FinFET. In some embodiments, retrieving the second gate resistance value from the resistance value reference includes using a second index value based on the location of the gate via along the width. In some embodiments, the gate via is one gate via of a plurality of gate vias positioned at a corresponding plurality of locations along the width, and modifying the IC layout diagram includes changing one or more locations of the plurality of locations. In some embodiments, receiving the first gate resistance value of the gate region includes the first gate resistance value being based on a uniform voltage distribution model, the location, and a gate region center location. In some embodiments, the location and the gate region center location are a same location, and receiving the first gate resistance value of the gate region includes the first gate resistance value being equal to zero. In some embodiments, receiving the second gate resistance value includes the second gate resistance value being based on an AC model and the location relative to the width. In some embodiments, the AC model includes an AC signal having an amplitude one or more orders of magnitude below a threshold voltage of a transistor corresponding to the gate region, gate via, and active region. In some embodiments, the AC model includes the AC signal applied to a gate structure represented as a lumped resistance, a distributed resistance, or a combination thereof. In some embodiments, the AC model includes the AC signal corresponding to a carrier signal, a data signal, a noise signal, or a combination thereof.

In some embodiments, a method of generating an IC layout diagram includes receiving an IC layout diagram including a gate region and a gate via, the gate via being positioned at a location within an active region of a FinFET and along a width of the gate region extending across the active region, receiving a first gate resistance value of the gate region, retrieving a second gate resistance value from a resistance value reference based on the location, the width, and a number of fins of the FinFET, using the first and second resistance values to determine that the IC layout diagram does not comply with a design specification, and based on the non-compliance with the design specification, modifying the IC layout diagram. In some embodiments, retrieving the second gate resistance value from the resistance value reference is based on the number of fins of the FinFET ranging from two to six. In some embodiments, receiving the first gate resistance value of the gate region includes the first gate resistance value being based on a uniform voltage distribution model, and receiving the second gate resistance value includes the second gate resistance value being based on an AC model. In some embodiments, the AC model includes an AC signal having an amplitude one or more orders of magnitude below a threshold voltage of a transistor corresponding to the FinFET, and the AC signal applied to a gate structure represented as a lumped resistance, a distributed resistance, or a combination thereof.

In some embodiments, a method of generating an IC layout diagram includes receiving an IC layout diagram including a gate region and first and second gate vias positioned at respective first and second locations within an active region and along a width of the gate region extending across the active region, receiving a first gate resistance value of the gate region, retrieving a second gate resistance value from a resistance value reference based on the first and second locations and the width, using the first and second resistance values to determine that the IC layout diagram does not comply with a design specification, and based on the non-compliance with the design specification, modifying the IC layout diagram. In some embodiments, receiving the first gate resistance value of the gate region includes the first gate resistance value being based on a uniform voltage distribution model, the first and second locations, and a gate region center location. In some embodiments, one of the first or second locations and the gate region center location are a same location, and the receiving the first gate resistance value of the gate region includes the first gate resistance value being equal to zero. In some embodiments, the first location is between the second location and the gate region center location, and receiving the first gate resistance value of the gate region includes the first gate resistance value being based solely on the first location. In some embodiments, receiving the second gate resistance value includes the second gate resistance value being based on an AC model and each of the first and second locations relative to the width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC) layout diagram, the method comprising:
   receiving an IC layout diagram comprising a gate region and a gate via, the gate via being positioned at a location within an active region and along a width of the gate region extending across the active region;
   receiving a first gate resistance value of the gate region;
   retrieving a second gate resistance value from a resistance value reference based on the location and the width;
   using the first and second resistance values to determine that the IC layout diagram does not comply with a design specification; and
   based on the non-compliance with the design specification, modifying the IC layout diagram.

2. The method of claim 1, wherein
   the receiving the IC layout diagram comprises receiving the IC layout diagram comprising a fin field-effect transistor (FinFET) comprising the gate region and the gate via, and
   the retrieving the second gate resistance value comprises retrieving the second gate resistance value from the resistance value reference using a first index value based on a number of fins of the FinFET.

3. The method of claim 2, wherein
   the retrieving the second gate resistance value from the resistance value reference further comprises using a second index value based on the location of the gate via along the width.

4. The method of claim 1, wherein
the gate via is one gate via of a plurality of gate vias positioned at a corresponding plurality of locations along the width, and
the modifying the IC layout diagram comprises changing one or more locations of the plurality of locations.

5. The method of claim 1, wherein
the receiving the first gate resistance value of the gate region comprises the first gate resistance value being based on a uniform voltage distribution model, the location, and a gate region center location.

6. The method of claim 5, wherein
the location and the gate region center location are a same location, and
the receiving the first gate resistance value of the gate region comprises the first gate resistance value being equal to zero.

7. The method of claim 1, wherein
the receiving the second gate resistance value comprises the second gate resistance value being based on an alternating current (AC) model and the location relative to the width.

8. The method of claim 7, wherein
the AC model comprises an AC signal having an amplitude one or more orders of magnitude below a threshold voltage of a transistor corresponding to the gate region, gate via, and active region.

9. The method of claim 8, wherein
the AC model further comprises the AC signal applied to a gate structure represented as a lumped resistance, a distributed resistance, or a combination thereof.

10. The method of claim 8, wherein
the AC model comprises the AC signal corresponding to a carrier signal, a data signal, a noise signal, or a combination thereof.

11. A method of generating an integrated circuit (IC) layout diagram, the method comprising:
receiving an IC layout diagram comprising a gate region and a gate via, the gate via being positioned at a location within an active region of a fin field-effect transistor (FinFET) and along a width of the gate region extending across the active region;
receiving a first gate resistance value of the gate region;
retrieving a second gate resistance value from a resistance value reference based on the location, the width, and a number of fins of the FinFET;
using the first and second resistance values to determine that the IC layout diagram does not comply with a design specification; and
based on the non-compliance with the design specification, modifying the IC layout diagram.

12. The method of claim 11, wherein
the retrieving the second gate resistance value from the resistance value reference is based on the number of fins of the FinFET ranging from two to six.

13. The method of claim 11, wherein
the receiving the first gate resistance value of the gate region comprises the first gate resistance value being based on a uniform voltage distribution model, and the receiving the second gate resistance value comprises the second gate resistance value being based on an alternating current (AC) model.

14. The method of claim 13, wherein the AC model comprises:
an AC signal having an amplitude one or more orders of magnitude below a threshold voltage of a transistor corresponding to the FinFET; and
the AC signal applied to a gate structure represented as a lumped resistance, a distributed resistance, or a combination thereof.

15. The method of claim 11, wherein
the gate via is one gate via of a plurality of gate vias positioned at a corresponding plurality of locations along the width, and
the retrieving a second gate resistance value from a resistance value reference is based on each location of the plurality of locations.

16. A method of generating an integrated circuit (IC) layout diagram, the method comprising:
receiving an IC layout diagram comprising a gate region and first and second gate vias positioned at respective first and second locations within an active region and along a width of the gate region extending across the active region;
receiving a first gate resistance value of the gate region;
retrieving a second gate resistance value from a resistance value reference based on the first and second locations and the width;
using the first and second resistance values to determine that the IC layout diagram does not comply with a design specification; and
based on the non-compliance with the design specification, modifying the IC layout diagram.

17. The method of claim 16, wherein
the receiving the first gate resistance value of the gate region comprises the first gate resistance value being based on a uniform voltage distribution model, the first and second locations, and a gate region center location.

18. The method of claim 17, wherein
one of the first or second locations and the gate region center location are a same location, and
the receiving the first gate resistance value of the gate region comprises the first gate resistance value being equal to zero.

19. The method of claim 17, wherein
the first location is between the second location and the gate region center location, and
the receiving the first gate resistance value of the gate region comprises the first gate resistance value being based solely on the first location.

20. The method of claim 16, wherein
the receiving the second gate resistance value comprises the second gate resistance value being based on an alternating current (AC) model and each of the first and second locations relative to the width.

* * * * *